(12) United States Patent
Hou

(10) Patent No.: US 11,075,353 B2
(45) Date of Patent: Jul. 27, 2021

(54) ORGANIC LIGHT-EMITTING DIODE DISPLAY PANEL AND MANUFACTURING METHOD THEREOF AND DISPLAY DEVICE

(71) Applicant: BOE Technology Group Co., Ltd., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/623,936

(22) PCT Filed: Apr. 3, 2019

(86) PCT No.: PCT/CN2019/081329
§ 371 (c)(1),
(2) Date: Dec. 18, 2019

(87) PCT Pub. No.: WO2019/201096
PCT Pub. Date: Oct. 24, 2019

(65) Prior Publication Data
US 2020/0176702 A1   Jun. 4, 2020

(30) Foreign Application Priority Data
Apr. 19, 2018   (CN) .......................... 201810354794.X

(51) Int. Cl.
*H01L 51/52* (2006.01)
*H01L 27/32* (2006.01)
*H01L 51/56* (2006.01)

(52) U.S. Cl.
CPC ...... *H01L 51/5209* (2013.01); *H01L 27/3211* (2013.01); *H01L 51/5215* (2013.01);
(Continued)

(58) Field of Classification Search
CPC ............. H01L 27/3246; H01L 27/3218; H01L 51/5209
See application file for complete search history.

(56) References Cited

U.S. PATENT DOCUMENTS

2013/0049028 A1* 2/2013 Kim .................... H01L 51/5218
257/88
2013/0126851 A1* 5/2013 Nishiyama .............. H01L 33/42
257/40
(Continued)

FOREIGN PATENT DOCUMENTS

CN    101101975 A    1/2008
CN    105097868 A    11/2015
(Continued)

OTHER PUBLICATIONS

International search report of PCT application No. PCT/CN2019/081329 dated Jul. 1, 2019.
(Continued)

*Primary Examiner* — Zandra V Smith
*Assistant Examiner* — John M Parker
(74) *Attorney, Agent, or Firm* — Fay Sharpe LLP

(57) ABSTRACT

The present disclosure discloses an organic light-emitting diode display panel and a manufacturing method thereof and a display device, and relates to the field of display technologies. The organic light-emitting diode display panel comprises: a base substrate; a pixel defining layer and a plurality of first electrodes on the base substrate, wherein the pixel defining layer defines, on the base substrate, a plurality of sub-pixel regions arranged in an array, one of the first electrodes is located in each of the sub-pixel regions, and the work function of a middle portion of the first electrode is less than the work function of a peripheral portion; an organic light-emitting layer on each of the first electrodes; and a second electrode electrically connected to the organic light-
(Continued)

emitting layer, wherein the first electrode is an anode and the second electrode is a cathode.

18 Claims, 13 Drawing Sheets

(52) U.S. Cl.
CPC .......... H01L 51/5221 (2013.01); H01L 51/56 (2013.01); *H01L 2251/306* (2013.01); *H01L 2251/308* (2013.01)

(56) References Cited

U.S. PATENT DOCUMENTS

| | | | | |
|---|---|---|---|---|
| 2014/0014913 | A1* | 1/2014 | Lee | H01L 51/52 257/40 |
| 2014/0326978 | A1 | 11/2014 | Suzuki et al. | |
| 2015/0014634 | A1* | 1/2015 | Kim | H01L 51/56 257/40 |
| 2015/0340413 | A1 | 11/2015 | Lee et al. | |
| 2016/0365534 | A1 | 12/2016 | Gao et al. | |
| 2019/0044077 | A1 | 2/2019 | Zhang | |

FOREIGN PATENT DOCUMENTS

| | | |
|---|---|---|
| CN | 106449717 A | 2/2017 |
| CN | 107591434 A | 1/2018 |
| CN | 108565352 A | 9/2018 |

OTHER PUBLICATIONS

First office action of Chinese application No. 201810354794.X dated Apr. 18, 2019.

Second office action of Chinese application No. 201810354794.X dated Sep. 25, 2019.

* cited by examiner

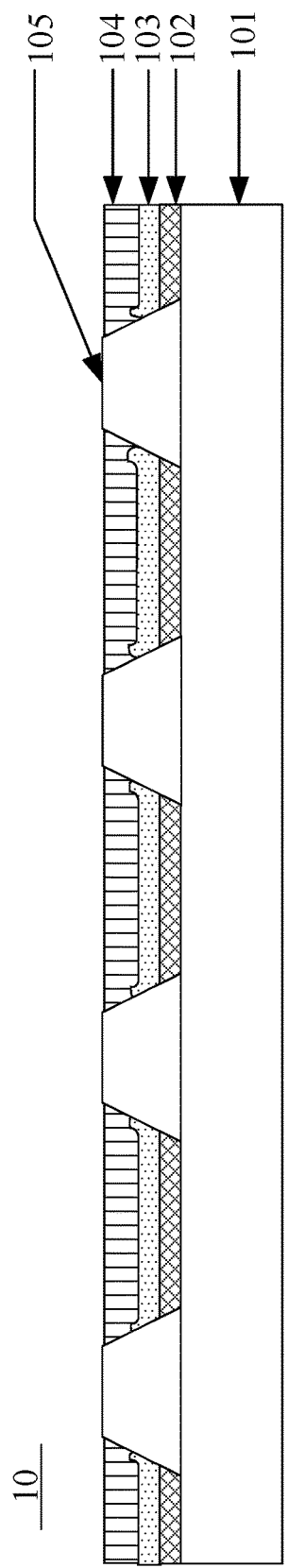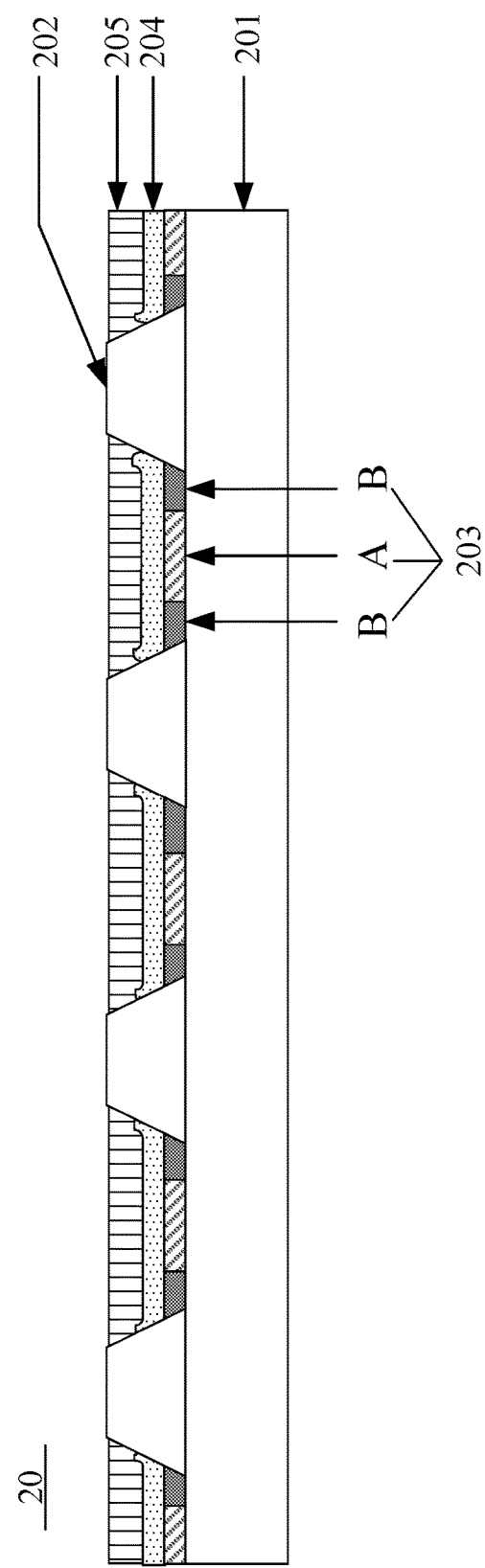

ORGANIC LIGHT-EMITTING DIODE DISPLAY PANEL AND MANUFACTURING METHOD THEREOF AND DISPLAY DEVICE

CROSS-REFERENCE TO RELATED APPLICATION

This application is a 371 of PCT Patent Application No. PCT/CN2019/081329 filed on Apr. 3, 2019, which claims priority to Chinese Patent Application No. 201810354794.X, filed on Apr. 19, 2018 and entitled "ORGANIC LIGHT-EMITTING DIODE DISPLAY PANEL AND MANUFACTURING METHOD THEREOF AND DISPLAY DEVICE", which is incorporated herein by reference in its entirety.

TECHNICAL FIELD

The present disclosure relates to the field of display technologies, and more particularly to an organic light-emitting diode display panel, a method for manufacturing same and a display device.

BACKGROUND

An organic light-emitting diode (OLED) display panel is a self-luminous display panel and has the advantages of a high response speed, a wide viewing angle, high brightness, bright colors, light weight and the like.

The OLED display panel in the related art includes a plurality of sub-pixel regions arranged in an array. A pixel defining layer is arranged around each of the sub-pixel regions. Two electrodes and an organic light-emitting layer are arranged in each of the sub-pixel regions. The organic light-emitting layer could emit light upon being applied a voltage through the two electrodes. An organic light-emitting material solution may be sprayed, through inkjet printing or the like, into the sub-pixel region defined by the pixel defining layer to form the organic light-emitting layer.

SUMMARY

The present disclosure provides an organic light-emitting diode display panel, a method for manufacturing same, and a display device. The technical solutions are as follows.

According to a first aspect of the present disclosure, there is provided an organic light-emitting diode display panel, including:

a base substrate;

a pixel defining layer and a plurality of first electrodes on the base substrate, wherein the pixel defining layer defines, on the base substrate, a plurality of sub-pixel regions arranged in an array, one of the first electrodes is formed in each of the sub-pixel regions, and the work function of a middle portion of the first electrode is less than the work function of a peripheral portion;

an organic light-emitting layer on each of the first electrodes; and a second electrode electrically connected to the organic light-emitting layer, wherein the first electrode is an anode and the second electrode is a cathode Optionally, the first electrode includes a center sub-electrode and at least one ring-shaped sub-electrode, each ring-shaped sub-electrode is arranged around the center sub-electrode, and the work function of the sub-electrode in the first electrode increases sequentially in the direction away from the center sub-electrode.

Optionally, the first electrode is made of a transparent conductive material.

Optionally, a material of the center sub-electrode includes any of indium tin oxide and zinc oxide; and a material of the ring-shaped sub-electrode includes any of indium zinc oxide and aluminum-doped zinc oxide.

Optionally, the number of each ring-shaped sub-electrode in the first electrode is one.

Optionally, the ring-shaped sub-electrode has a width of 3-10 microns.

Optionally, the first electrode meets at least one of the followings:

the center sub-electrode is rectangular and the ting-shaped sub-electrode is square ring-shaped; and a thickness of the center sub-electrode is greater than that of the ring-shaped sub-electrode.

Optionally, the first electrode comprises a center sub-electrode and one ring-shaped sub-electrode, the ring-shaped sub-electrode is arranged around the center sub-electrode, and the work function of the ring-shaped sub-electrode is greater than the work function of the center sub-electrode;

the center sub-electrode is rectangular and the ring-shaped sub-electrode is square ring-shaped;

a material of the center sub-electrode comprises any of indium tin oxide and zinc oxide; and a material of the ring-shaped sub-electrode comprises any of indium zinc oxide and aluminum-doped zinc oxide According to a second aspect of the present disclosure, there is provided a method for manufacturing an organic light-emitting diode display panel, including:

forming a pixel defining layer and a plurality of first electrodes on a base substrate, wherein the pixel defining layer defines, on the base substrate, a plurality of sub-pixel regions arranged in an array, one of the first electrodes is formed in each of the sub-pixel regions, and the work function of a middle portion of the first electrode is less than the work function of a peripheral portion;

forming an organic light-emitting layer on each of the first electrodes; and forming, on the base substrate on which the organic light-emitting layer has been formed, a second electrode electrically connected to the organic light-emitting layer, wherein the first electrode is an anode and the second electrode is a cathode.

Optionally, the forming a pixel defining layer and a plurality of first electrodes on a base substrate includes:

forming the plurality of first electrodes on the base substrate; and forming the pixel defining layer on the base substrate, on which the plurality of first electrodes have been formed.

The first electrode includes a center sub-electrode and at least one ring-shaped sub-electrode, each ring-shaped sub-electrode is arranged around the center sub-electrode, and the work function of the sub-electrode in the first electrode increases sequentially in the direction away from the center sub-electrode Optionally, the first electrode is made of a transparent conductive material.

Optionally, a material of the center sub-electrode includes any of indium tin oxide and zinc oxide; and a material of the ring-shaped sub-electrode includes any of indium zinc oxide and aluminum-doped zinc oxide.

Optionally, the number of the ring-shaped sub-electrode in the first electrode is one.

Optionally, the forming process of the plurality of first electrodes includes:

forming a first sub-electrode material layer on the base substrate;

forming a first photoresist layer on the first sub-electrode material layer;

exposing, developing and etching the first sub-electrode material layer, on which the first photoresist layer has been formed, to obtain a first sub-electrode pattern with a first photoresist pattern, wherein the first sub-electrode pattern includes the plurality of first sub-electrodes;

forming a second sub-electrode material layer on the base substrate, wherein the second sub-electrode material layer covers the first sub-electrode pattern with the first photoresist pattern;

forming a second photoresist layer on the second sub-electrode material layer;

exposing, developing and etching the second sub-electrode material layer, on which the second photoresist layer has been formed, to obtain a second sub-electrode pattern with a second photoresist pattern, wherein the second sub-electrode pattern includes the plurality of second sub-electrodes; and peeling off the first photoresist pattern and the second photoresist pattern to obtain the first electrode, wherein the first sub-electrode and the second sub-electrode are the center sub-electrode/the ring-shaped sub-electrode or the ring-shaped sub-electrode/the center sub-electrode.

Optionally, the ring-shaped sub-electrode has a width of 3-10 microns.

Optionally, the first electrode meets at least one of the followings:

the center sub-electrode is rectangular and the ring-shaped sub-electrode is square ring-shaped; and a thickness of the center sub-electrode is greater than that of the ring-shaped sub-electrode.

According to a third aspect of the present disclosure, there is provided a display device, including the organic light-emitting diode display panel according to the first aspect.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings as described below show merely some embodiments of the present disclosure, and a person of ordinary skill in the art can also derive other drawings from these accompanying drawings without creative efforts.

FIG. 1 is a structural diagram of a partial section of an OLED display panel in the related art;

FIG. 2 is a structural diagram of a partial section of an OLED display panel provided in the embodiments of the present disclosure;

Figure 3:
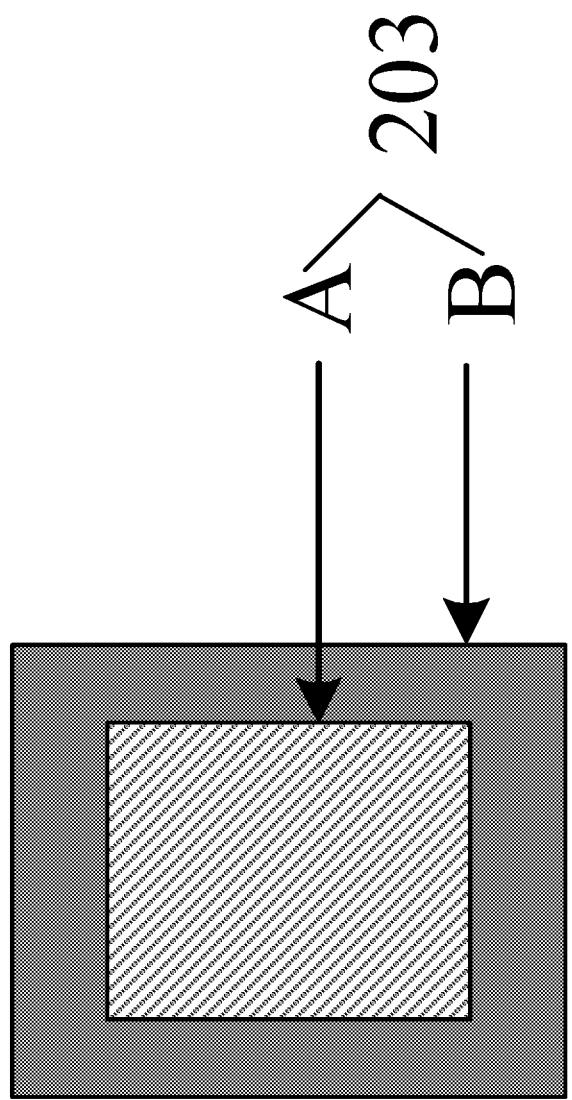
FIG. 3 is a top view structural diagram showing one first electrode in the OLED display panel shown in FIG. 2.

Specific embodiments of the present disclosure are shown through the above accompanying drawings and are described in more detail below. These accompanying drawings and text description are intended to explain the concept of the present disclosure for a person skilled in the art with reference to specific embodiments, rather than limiting the scope of the concept of the present disclosure in any manner.

DETAILED DESCRIPTION

The embodiments of the present disclosure will be described in further detail with reference to the accompanying drawings, to present the objects, technical solutions and principles of the present disclosure more clearly.

Compared with an LCD display panel, an OLED display panel has the advantages of self-luminescence, high response speed, a wide viewing angle, high brightness, bright colors, light weight and the like. Methods for manufacturing a film layer in the OLED display panel may include vacuum evaporation and a solution process. The solution process may further include a spin-coating technology, an inkjet printing technology, a nozzle coating technology and the like, is suitable for film formation of polymer materials and soluble small molecules, and has the advantage of low device cost and has an outstanding advantage in large-scale production and large-size production, especially the inkjet printing technology.

Each OLED device in the OLED display panel includes a cathode, an organic light-emitting layer, an anode and the like. The organic light-emitting layer may be manufactured with the above inkjet printing technology. However, when using the inkjet printing technology to make the organic light-emitting layer, it needs to form a pixel defining layer on a glass substrate first, wherein the pixel defining layer defines a plurality of sub-pixel regions on the glass substrate; and then spray an organic light-emitting material solution into the sub-pixel regions defined by the pixel defining layer to form the organic light-emitting layer. The uniformity of the organic light-emitting layer directly affects the brightness uniformity of light emitted by the OLED display panel.

After a voltage is applied to the cathode and the anode on two sides of the organic light-emitting layer, electrons and holes are injected into the organic light-emitting layer from the cathode and the anode respectively. The electrons fill the holes upon encountering the holes in the organic light-emitting layer. This filling process is also called recombination of the electron and the hole. In this filling process, the electrons release energy, so that the organic light-emitting layer emits light, and the brightness of the emitted light depends on the magnitude of the voltage applied to the cathode and anode: the higher the voltage is, the more electrons and holes would encounter in the organic light-emitting layer, so that more electrons release energy, and in turn the brightness of the light emitted by the organic light-emitting layer would be higher.

In the related art, when the organic light-emitting layer of the OLED display panel is formed, a portion of organic light-emitting material solution in contact with the pixel defining layer may climb on the pixel defining layer. As a result, in the formed organic light-emitting layer, the region close to the pixel defining layer is relatively thicker, and the region away from the pixel defining layer is relatively thinner. Since the thicker region has a lower probability in recombination of electrons and holes than the thinner region, the thicker region would have lower brightness than the thinner region when the organic light-emitting layer emits light. Consequently, the brightness uniformity of light emitted by the organic light-emitting layer is relatively poorer.

Exemplarily, FIG. 1 is a structural diagram of a partial section of an OLED display panel 10 in the related art. The OLED display panel 10 includes a base substrate 101 and a pixel defining layer 105. The pixel defining layer 105 defines, on the base substrate 101, a plurality of sub-pixel regions arranged in an array. A first electrode 102, an organic light-emitting layer 103 and a second electrode 104 are arranged in each of the sub-pixel regions. The first electrode 102 and the second electrode 104 can be used as an anode and a cathode of an OLED respectively. The organic light-emitting layer 103 may emit light upon being applied a voltage through the first electrode 102 and the second electrode 104. Then, An inkjet printing technology is used to spray an organic light-emitting material solution onto the first electrode 102 in the sub-pixel region defined by the pixel defining layer to form the organic light-emitting layer 103.

However, in the process of forming the organic light-emitting layer 103 through the inkjet printing technology, a portion of organic light-emitting material solution in contact with the pixel defining layer 105 may climb on the pixel defining layer 105 to form the structure of the organic light-emitting layer 103 shown in FIG. 1. In FIG. 1, in the organic light-emitting layer 103, the thickness of the region close to the pixel defining layer 105 is greater than the thickness of the region away from the pixel defining layer 105. Then, in the process of emitting light by the OELD display panel, the light emitted by the region close to the pixel defining layer 105 (i.e., an edge region of the sub-pixel region) in the organic light-emitting layer 103 has relatively lower brightness, and the light emitted by the region away from the pixel defining layer 105 (i.e., a center region of the sub-pixel region) in the organic light-emitting layer 103 has relatively higher brightness, that is, a coffee-ring effect occurs, which results in the problem in the related art that the light emitted by the organic light-emitting layer has relatively poorer brightness uniformity.

The embodiments of the present disclosure provide an OLED display panel which may, based on the work function of the electrode material, mitigate the problem in the related art that the light emitted by the organic light-emitting layer has relatively poorer brightness uniformity. In order to better explain the OLED display panel provided in the embodiments of the present disclosure, the work function is briefly introduced here first.

The cathode and the anode of an OLED may be made of metal and metal oxide respectively. Both metal and metal oxide have a work function. The magnitude of the work function indicates the capacity of metal and metal oxide in binding electrons. The greater the work function is, the less likely the electron leaves an object. For the cathode, the smaller the work function is, the higher the electron injection efficiency is and the higher the brightness of the emitted light is. For the anode, the greater the work function is, the higher the hole injection efficiency is and the higher the brightness of the emitted light is. In the process of applying a voltage, a large number of holes would be caused to leave the anode. In the process of injecting into the cathode from the anode, the large number of holes may encounter more electrons and release more energy when passing through the organic light-emitting layer, so that the light emitted by the organic light-emitting layer has a higher brightness. That is, the work function of an anode is proportional to the brightness of the light emitted by the light-emitting layer driven by the electrode.

FIG. 2 is a diagram of a partial section of an OLED display panel provided in an embodiments of the present disclosure. With reference to FIG. 2, the OLED display panel 20 may include:

a base substrate 201, a pixel defining layer 202 and a plurality of first electrodes 203 on the base substrate 201, an organic light-emitting layer 204 on each of the first electrodes 203 and a second electrode 205 electrically connected to the organic light-emitting layer 204. The first electrode 203 and the second electrode 205 are different in polarity, that is, one of the first electrode 203 and the second electrode 205 is an anode and the other is a cathode. For example, the first electrode 203 may be the anode and the second electrode 205 may be the cathode.

Here, the pixel defining layer 202 defines, on the base substrate 201, a plurality of sub-pixel regions arranged in an array, one of the first electrodes 203 is formed in each of the sub-pixel regions, and the work function of the first electrode 203 increases sequentially in the direction away from the center of the first electrode.

In a first implementation mode, as shown in FIG. 2, the first electrode 203 includes at least two sub-electrodes. The at least two sub-electrodes include a center sub-electrode A and at least one ring-shaped sub-electrode B. Each ring-shaped sub-electrode B is arranged around the center sub-electrode A, that is, the center sub-electrode A and the ring-shaped sub-electrode B are arranged on a same layer in a nested manner. The work function of the sub-electrode in each first electrode 203 increases sequentially in the direction away from the center sub-electrode A. The sub-electrodes in each first electrode 203 are adjoined sequentially from the center to the edge, that is, there is no gap among the various sub-electrodes, so as to guarantee that the voltage is effectively applied to the first electrode. The plurality of sub-pixel regions may constitute a pixel region. For example, a sub-pixel region with red organic light-emitting material solution (i.e., a red sub-pixel region), a sub-pixel region with green organic light-emitting material solution (i.e., a green sub-pixel region), and a sub-pixel region with blue organic light-emitting material solution (i.e., a blue sub-pixel region) may constitute one pixel region.

In a second implementation mode, the first electrode includes at least three sub-electrodes. The at least three sub-electrodes include a center sub-electrode and at least two strip-shaped sub-electrodes. Each of the strip-shaped sub-electrodes is arranged around the center sub-electrode and the at least two strip-shaped sub-electrodes constitute one ring-shaped sub-electrode around the center sub-electrode (in this case, it corresponds to that the ring-shaped sub-electrode in the first implementation mode is divided into a plurality of strip-shaped sub-electrodes). The work function of the sub-electrode in each first electrode increases sequentially in the direction away from the center sub-electrode. Exemplarily, if the center sub-electrode is rectangular, the at least two strip-shaped sub-electrodes are two semi-ring-shaped (i.e., square semi-ring-shaped) sub-electrodes, or the at least two strip-shaped sub-electrodes are four rectangular sub-electrodes. Exemplarily, if the center sub-electrode is circular, the at least two strip-shaped sub-electrodes are two semi-ring-shaped (i.e., circular semi-ring-shaped) sub-electrodes, or the at least two strip-shaped sub-electrodes are four rectangular sub-electrodes. It should be noted that the at least two strip-shaped sub-electrodes may be of other shapes as long as they could constitute the ring-shaped sub-electrode.

Since the thickness of the organic light-emitting layer increases sequentially in the direction towards the pixel defining layer, when forming the first electrode, the work function of the first electrode is produced as being increased sequentially in the direction away from the center of the first electrode. For example, the work function of the sub-electrodes in the first electrode increases sequentially in the direction away from the center sub-electrode, and thus the brightness uniformity of emitted light in the sub-pixel region may be adjusted by employing the difference between the work functions of different sub-electrodes. The relatively thicker region of the organic light-emitting layer and the sub-electrode(s) having a relatively greater work function are correspondingly arranged (the expression "correspondingly arranged" refers to that the orthographic projection of the relatively thicker region of the organic light-emitting layer onto the base substrate partially or completely overlaps with the orthographic projection of the region, where the sub-electrode having the relatively greater work function is located, onto the base substrate, and usually, the two orthographic projections completely overlap with each other). The sub-electrode having the relatively greater work function could cause more holes to be injected into the relatively thicker region of the organic light-emitting layer. On the contrary, the relatively thinner region of the organic light-emitting layer and the sub-electrode having a relatively smaller work function are correspondingly arranged (the expression "correspondingly arranged" refers to that the orthographic projection of the relatively thinner region of the organic light-emitting layer onto the base substrate partially or completely overlaps with the orthographic projection of the region, where the sub-electrode having the relatively smaller work function is located, onto the base substrate, and usually, the two orthographic projections completely overlap with each other). The sub-electrode having the relatively smaller work function may cause fewer holes to be injected into the relatively thinner region of the organic light-emitting layer. With such arrangement, the brightness difference between the two regions could be corrected based on the difference values between the numbers of the holes injected into the two regions. Thus, the brightness uniformity of light emitted by the organic light-emitting layer in the sub-pixel regions is effectively improved and the difference in brightness between the edge and the center of the organic light-emitting layer is reduced.

Optionally, the number of the ring-shaped sub-electrode(s) in the first electrode 203 may be one, that is, the first electrode includes one center sub-electrode and one ring-shaped sub-electrode. FIG. 2 shows the structure including the center sub-electrode A and one ring-shaped sub-electrode B arranged around the center sub-electrode A. Of course, in the embodiments of the present disclosure, one first electrode may further include a plurality of ring-shaped sub-electrodes B, which is not further described in detail here.

It should be noted that FIG. 2 shows a partial structural diagram of an OLED display panel including a plurality of sub-pixel regions provided in the embodiments of the present disclosure. All the plurality of sub-pixel regions have the same structure. For example, the first electrode 203 in each of the sub-pixel regions includes the center sub-electrode A and at least one ring-shaped sub-electrode B arranged around the center sub-electrode A. This is not described in detail in the embodiments of the present disclosure.

To clearly describe the structure of the first electrode 203, reference can be made to FIG. 3. FIG. 3 is a top view structural diagram of one first electrode 203 in the OLED display panel shown in FIG. 2. It can be clearly seen from FIG. 3 that the first electrode 203 includes the center sub-electrode A and one ring-shaped sub-electrode B arranged around the center sub-electrode A.

In summary, the OLED display panels provided in the embodiments of the present disclosure include a plurality of sub-pixel regions arranged in an array, one first electrode is formed in each of the sub-pixel regions, and the work function of the first electrode increases sequentially in the direction away from the center of the first electrode. With such arrangement, the number of the holes injected into different regions of the light-emitting electrode layer could be adjusted to correct the brightness difference of the light-emitting electrode layer caused by the non-uniform thickness. Thus, this solves the problem in the related art that the light emitted by the organic light-emitting layer has relatively poorer brightness uniformity and the brightness uniformity of light emitted by the organic light-emitting layer is improved.

Optionally, in the embodiments of the present disclosure, the first electrode may be a cathode or an anode. Depending on the types of OLED display panels (for example, one-sided emission type or dual-sided emission type), at least one of the cathode and the anode (i.e., the electrode on the light-emitting side of the display panel) is made of a transparent conductive material. The embodiments of the present disclosure are illustrated by the example that the first electrode is the anode and includes the center sub-electrode and one ring-shaped sub-electrode. Optionally, each of the first electrodes may be made of the transparent conductive material, that is, the sub-electrode in each first electrode is made of the transparent conductive material.

It can be seen from the above analysis that in order to mitigate the problem of high brightness in the center and low brightness at the edge in each sub-pixel region, the work function of the sub-electrode in the first electrode in each sub-pixel region of the OLED display panel provided in the embodiments of the present disclosure increases sequentially in the direction away from the center sub-electrode. Therefore, when choosing different materials as the sub-electrodes in the first electrode, the work functions of the different materials should be taken into account.

Optionally, in a first implementation mode, when the first electrode includes a center sub-electrode and one ring-shaped sub-electrode, the material of the center sub-electrode may include indium tin oxide (ITO) or zinc oxide (ZnO) and the material of the ring-shaped sub-electrode may include indium-zinc oxide (IZO) or aluminum-doped zinc oxide (AZO). The ITO has a work function of 4.8 electron Volts (eV) approximately, the ZnO has a work function of 4.2 eV to 4.5 eV approximately, the AZO has a work function of 5.2 eV approximately, and the IZO has a work function of 4.9 eV to 5.2 eV approximately. Both work functions of the ITO and the ZnO, which are used as materials of the center sub-electrode, are smaller than the work functions of the AZO and IZO, which are used as materials of the ring-shaped sub-electrode. In a second implementation mode, when the first electrode includes a center sub-electrode and at least two strip-shaped sub-electrodes, the material of the center sub-electrode may include indium tin oxide or zinc oxide and the material of the strip-shaped sub-electrodes may include indium-zinc oxide or aluminum-doped zinc oxide.

The OLED display panel may have different pixel density (i.e., pixel per inch, PPI). PPI refers to the number of pixels in each inch of the OLED display panel. A higher PPI value indicates that a display screen could display images at higher density. The higher the density is, the richer the detail of the picture that is displayed by the OLED display panel is. The sub-pixel regions of OLED display panels having different PPI values are also different in size. For example, a sub-pixel region of an OLED display panel with a higher PPI value is smaller than that of a sub-pixel region of an OLED display panel with a lower PPI value. Exemplarily, one sub-pixel region may have a width of 20 to 100 microns.

Although sub-pixel regions have different sizes, the portion of organic light-emitting material solution climbing on the pixel defining layer at the peripheral portion of each sub-pixel region has similar appearance (the appearance may make reference to the appearance of the organic light-emitting layer shown in the above embodiments). Therefore, the width of the relatively thicker regions of the organic light-emitting layer close to the pixel defining layer are also similar in sub-pixel regions having different sizes. Thus, by disposing a ring-shaped sub-electrode with a width corresponding to the width of the relatively thicker regions, the problem that the light emitted by the organic light-emitting layer has relatively poorer brightness uniformity could be mitigated. Optionally, the ring-shaped sub-electrode may have a width of 3 to 10 microns, such as 5 microns.

Figure 4:
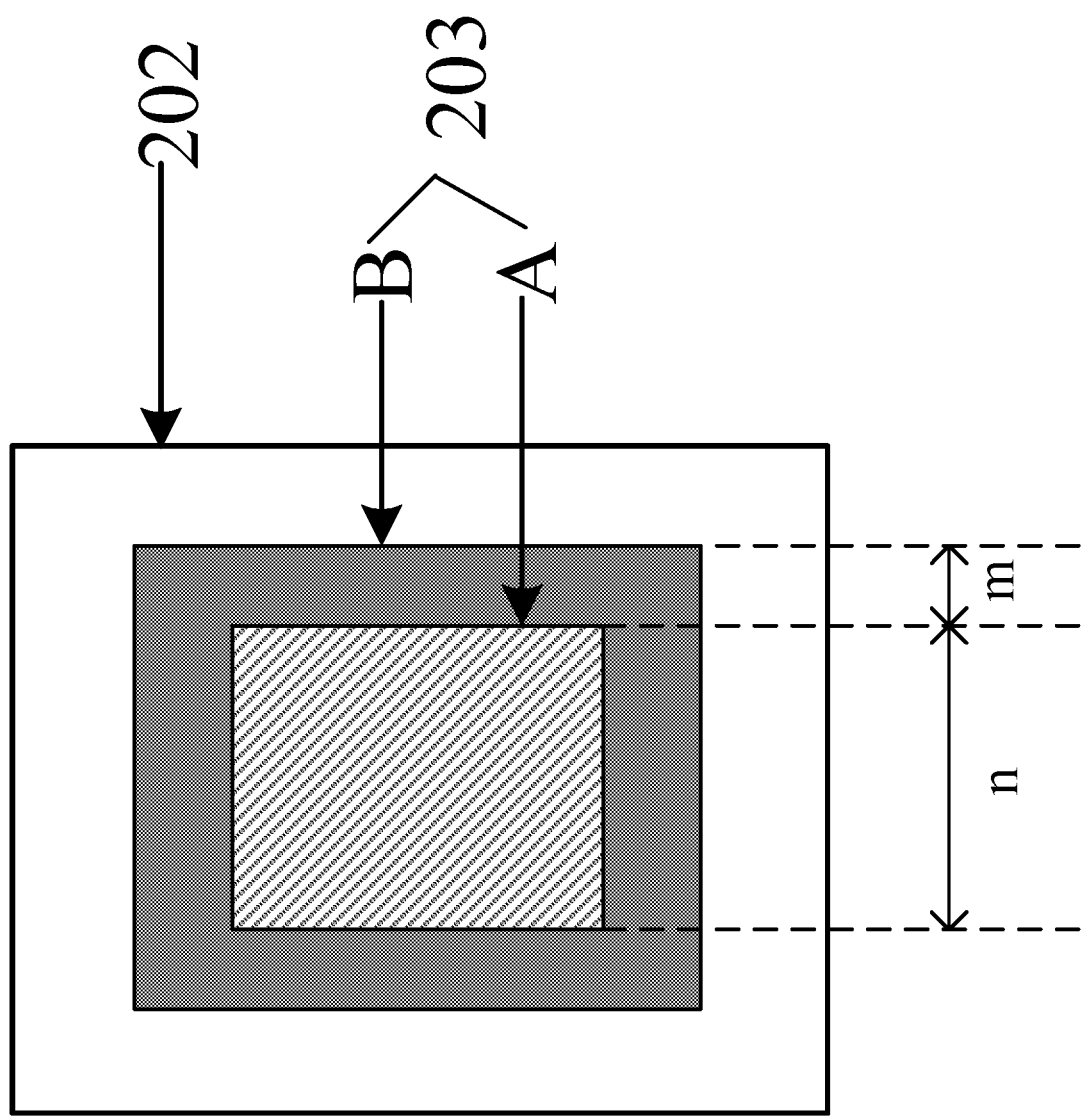
FIG. 4 is a top view partial structural diagram showing a base substrate, on which the first electrode and a pixel defining layer have been formed, provided in the embodiments of the present disclosure.

Exemplarily, as shown in FIG. 4 which is a top view of partial structural diagram of a base substrate, on which a first electrode and a pixel defining layer have been formed (in FIG. 4, the base substrate is shielded by the first electrode and the pixel defining layer), in the above embodiments. In this figure, one center sub-electrode A and one ring-shaped sub-electrode B are formed in the sub-pixel region defined by the pixel defining layer 202, the center sub-electrode A is rectangular and the ring-shaped sub-electrode B is square ring-shaped. The ring-shaped sub-electrode B has a width m of 5 microns, and the width n of the center sub-electrode A may be set according to the size of the sub-pixel region required by the PPI of the OLED display panel. With reference to FIG. 4, the width m of the ring-shaped sub-electrode B refers to the ring width of the ring-shaped sub-electrode. If the ring-shaped sub-electrode is square ring-shaped, the ring width of the square ring refers to the ring width of other regions except corners of the square ring. Of course, the first electrode provided in the embodiments of the present disclosure may be of other shapes. For example, the first electrode may be a special-shaped electrode. For instance, if the first electrode is a circular electrode, the center sub-electrode is circular and the ring-shaped sub-electrode may be circular ring-shaped. The shape of the first electrode is not limited in the embodiments of the present disclosure herein.

Optionally, the above embodiments are demonstrated by using one ring-shaped sub-electrode in each of the first electrodes. Of course, in other embodiments of the present disclosure, the number of the ring-shaped sub-electrode in each of the first electrodes may be an integer greater than 1 and at this time, the ring-shaped sub-electrode furthest from the center sub-electrode may be set to 5 microns in width.

Figure 5:
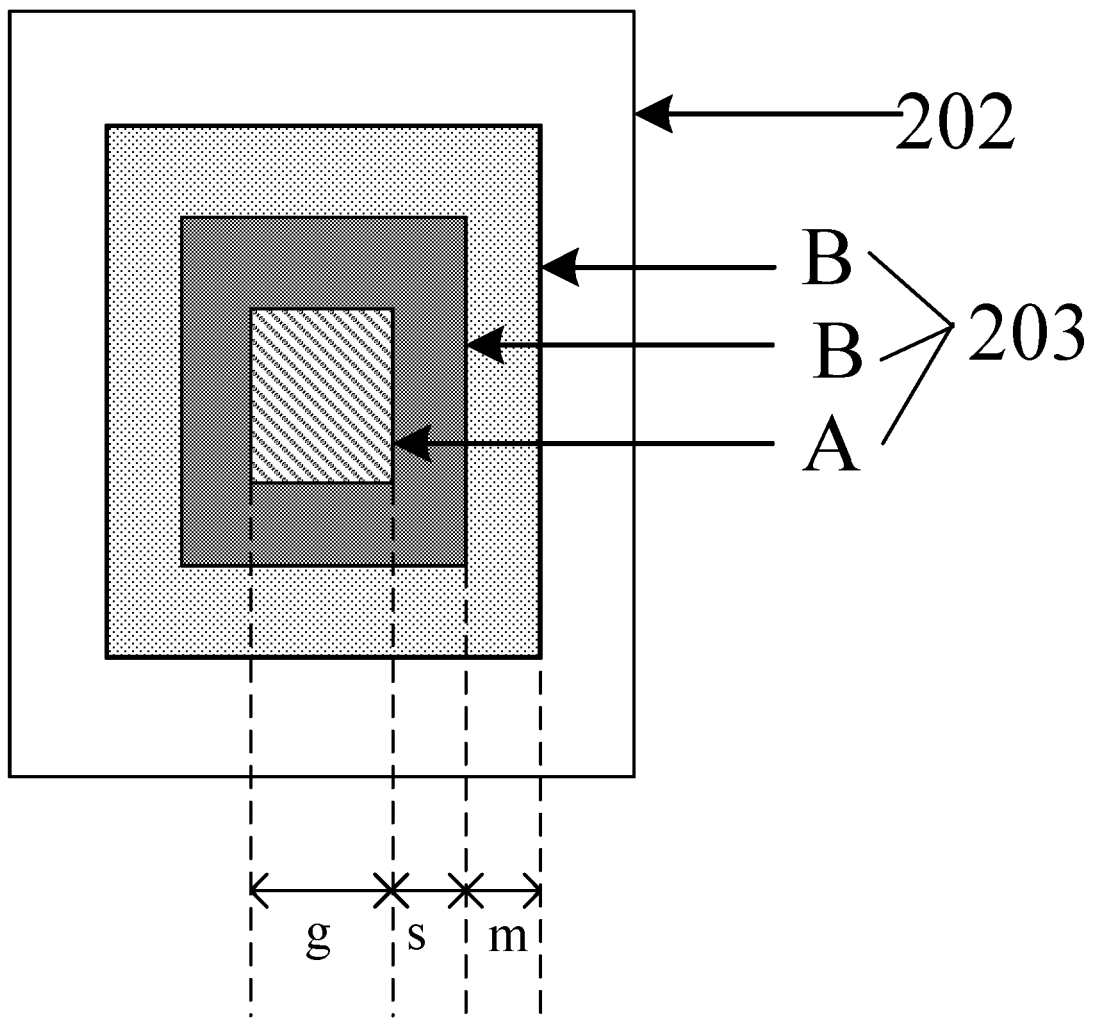
FIG. 5 is a top view partial structural diagram showing another base substrate, on which the first electrode and the pixel defining layer have been formed, provided in the embodiments of the present disclosure.

Exemplarily, as shown in FIG. 5 which is a top view of partial structural diagram of another base substrate, on which the first electrode and the pixel defining layer have been formed (in FIG. 5, the base substrate is shielded by the first electrode and the pixel defining layer), in the above embodiments. In this figure, one center sub-electrode A and two ring-shaped sub-electrodes B are formed in the sub-pixel region defined by the pixel defining layer 202. The width m of the ring-shaped sub-electrode B furthest from the center sub-electrode is 5 microns, and the width g of the center sub-electrode A and the width s of the other ring-shaped sub-electrode B may be set according to the size of the sub-pixel region required by the PPI of the OLED display panel and the region of which the light brightness needs to be adjusted slightly. When the number of the ring-shaped sub-electrodes in each of the first electrodes is an integer greater than 2, the arrangement could be similar, which is not described in the embodiments of the present disclosure.

In one possible example, the thickness of the center sub-electrode and the ring-shaped sub-electrode of the first electrode may be the same or different. For example, the thickness of the center sub-electrode may be greater than that of the ring-shaped sub-electrode. As such, when the organic light-emitting layer is formed subsequently, since the ring-shaped sub-electrode is relatively thin, the climbing of the organic light-emitting material solution could be alleviated to a certain extent, and thus the organic light-emitting layer as finally formed would be more uniform, thereby further improving the uniformity of emitted light.

In summary, the OLED display panels provided in the embodiments of the present disclosure include the plurality of sub-pixel regions arranged in an array, one first electrode is formed in each of the sub-pixel regions, and the work function of the first electrode increases sequentially in the direction away from the center of the first electrode. With such arrangement, the number of the holes injected into different regions of the light-emitting electrode layer could be adjusted to correct the brightness difference of the light-emitting electrode layer caused by the non-uniform thickness. Thus, this solves the problem in the related art that the light emitted by the organic light-emitting layer has relatively poorer brightness uniformity and the brightness uniformity of light emitted by the organic light-emitting layer is improved.

Figure 6:
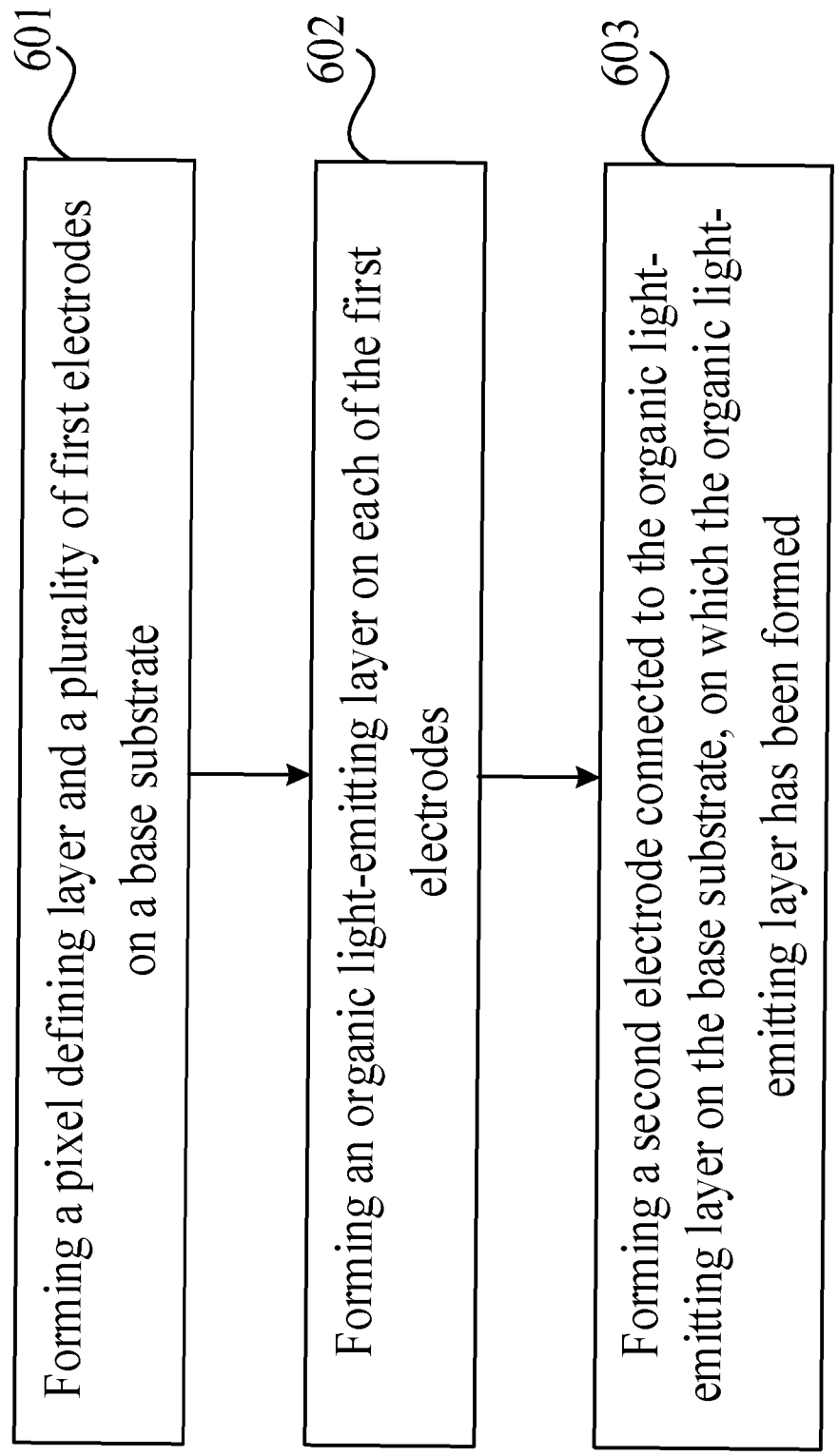
FIG. 6 is a flowchart of a method for manufacturing OLED display panels provided in the embodiments of the present disclosure.

FIG. 6 is a flowchart of a method for manufacturing an OLED display panel according to one exemplary embodiment. As shown in FIG. 6, the method may include the following steps.

In step 601, a pixel defining layer and a plurality of first electrodes are formed on a base substrate.

The pixel defining layer defines, on the base substrate, a plurality of sub-pixel regions arranged in an array, one of the first electrodes is formed in each of the sub-pixel regions, and the work function of the first electrode increases sequentially in the direction away from the center of the first electrode. For example, the first electrode includes a center sub-electrode and at least one ring-shaped sub-electrode, each ring-shaped sub-electrode is arranged around the center sub-electrode, and the work function of the sub-electrode in the first electrode increases sequentially in the direction away from the center sub-electrode.

In step 602, an organic light-emitting layer is formed on each of the first electrodes.

In step 603, a second electrode connected to the organic light-emitting layer is formed on the base substrate, on which the organic light-emitting layer has been formed.

The connection here refers to a contact connection and an electrical connection.

In summary, in the methods for manufacturing OLED display panels provided in the embodiments of the present disclosure, the plurality of sub-pixel regions arranged in the array is formed on the base substrate, one of the first electrodes is formed in each of the sub-pixel regions, and the work function of the first electrode increases sequentially in the direction away from the center of the first electrode. With such arrangement, the number of the holes injected into different regions of the light-emitting electrode layer could be adjusted to correct the brightness difference of the light-emitting electrode layer caused by the non-uniform thickness. This solves the problem in the related art that the light emitted by the organic light-emitting layer has relatively poorer brightness uniformity and the brightness uniformity of light emitted by the organic light-emitting layer is improved.

Figure 7:
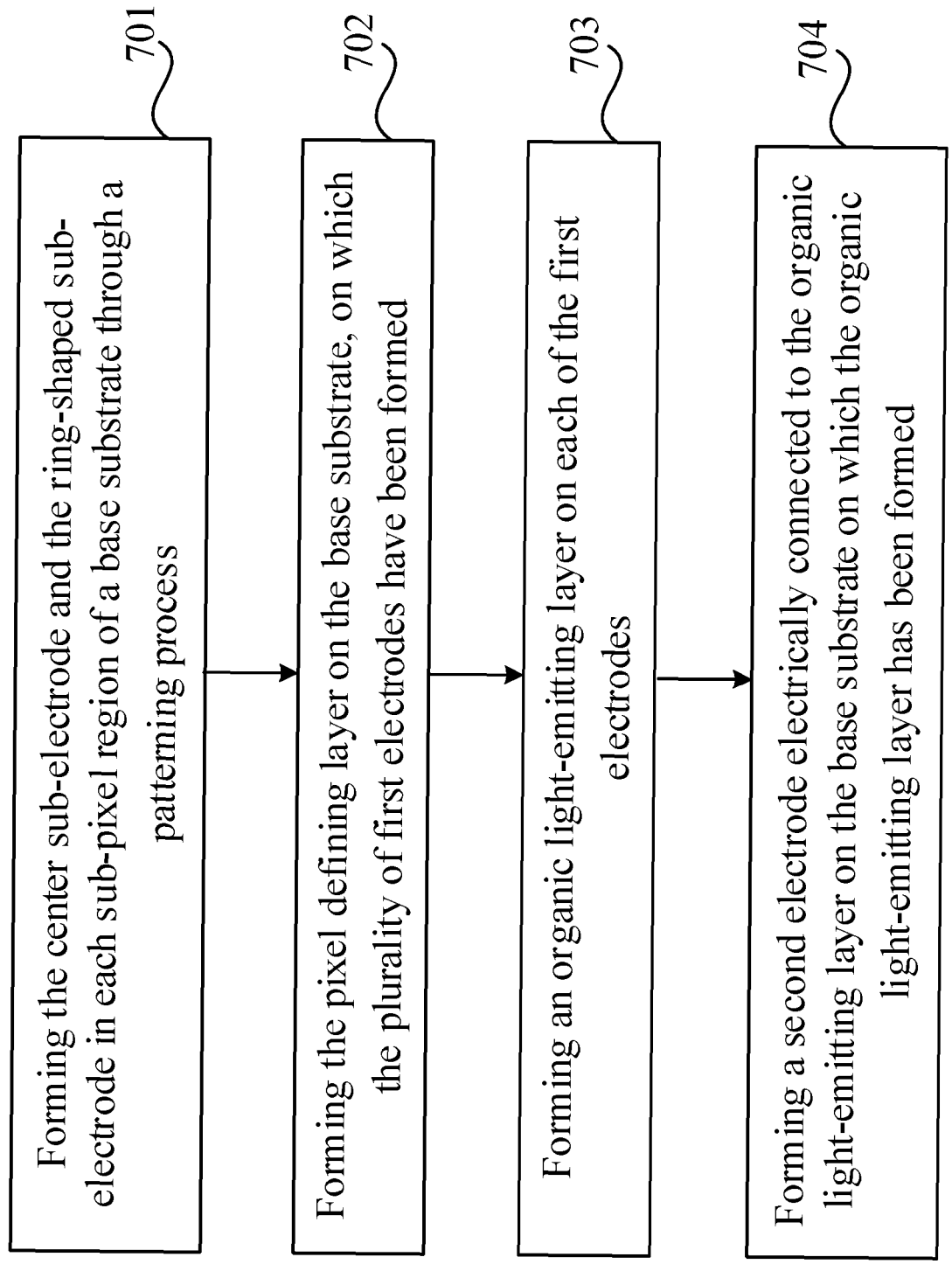
FIG. 7 is a flowchart of another method for manufacturing OLED display panels provided in the embodiments of the present disclosure.

FIG. 7 is a flowchart of another method for manufacturing OLED display panels according to one exemplary embodiment. The OLED display panel includes a plurality of first electrodes, and each of the first electrodes includes a center sub-electrode and one ring-shaped sub-electrode arranged around the center sub-electrode. As shown in FIG. 7, the method may include the following steps.

In step 701, the center sub-electrode and the ring-shaped sub-electrode are formed in each sub-pixel region of a base substrate through a patterning process.

The base substrate may be a transparent base substrate (such as a glass substrate) which may be a single-layer structure made of inorganic materials such as glass or quartz, and may also be a multi-layer structure formed through stacking inorganic and organic material layers.

The forming process of step 701 may have a plurality of implementation modes. In one possible implementation mode, the center sub-electrode and the ring-shaped sub-electrode may be respectively formed by forming a material layer of the sub-electrode needed to be formed on the base substrate, and then preforming one-time patterning process on the material layer. The patterning process includes: photoresist coating, exposure, development, etching and photoresist peeling. In order to avoid interference between two patterning processes, the latter patterning process may be executed through an ashing patterning process (that is, the mask is a grayscale mask).

In another possible implementation mode, step 701 above includes: forming a first sub-electrode material layer on the base substrate; forming a first photoresist layer on the first sub-electrode material layer; exposing, developing and etching the first sub-electrode material layer, on which the first photoresist layer has been formed, to obtain a first sub-electrode pattern with a first photoresist pattern, wherein the first sub-electrode pattern includes a plurality of first sub-electrodes; forming a second sub-electrode material layer on the base substrate, wherein the second sub-electrode material layer covers the first sub-electrode pattern with the first photoresist pattern; forming a second photoresist layer on the second sub-electrode material layer; exposing, developing and etching the second sub-electrode material layer, on which the second photoresist layer has been formed, to obtain a second sub-electrode pattern with a second photoresist pattern, wherein the second sub-electrode pattern includes a plurality of second sub-electrodes; and peeling off the first photoresist pattern and the second photoresist pattern to obtain the first electrode.

Here, the first sub-electrode and the second sub-electrode are the center sub-electrode/the ring-shaped sub-electrode or the ring-shaped sub-electrode/the center sub-electrode, respectively. That is, the center sub-electrode may be formed first and then the ring-shaped sub-electrode is formed, or the ring-shaped sub-electrode may be formed first and then the center sub-electrode is formed. The first-formed photoresist pattern on the sub-electrode pattern is not peeled off at first, which could protect the first-formed sub-electrode pattern in the process of forming the latter sub-electrode pattern. To facilitate the reader's understanding, the embodiments of the present disclosure are demonstrated by the example that the center sub-electrode is formed first and then the ring-shaped sub-electrode is formed.

When employing the methods for manufacturing OLED display panels provided in the embodiments of the present disclosure, a center sub-electrode material layer may be formed on the base substrate first and then the center sub-electrode is formed on the center sub-electrode material layer through a patterning process. In the embodiments of the present disclosure, the patterning process may include photoresist coating, photoresist exposure, development and etching.

Figure 8:
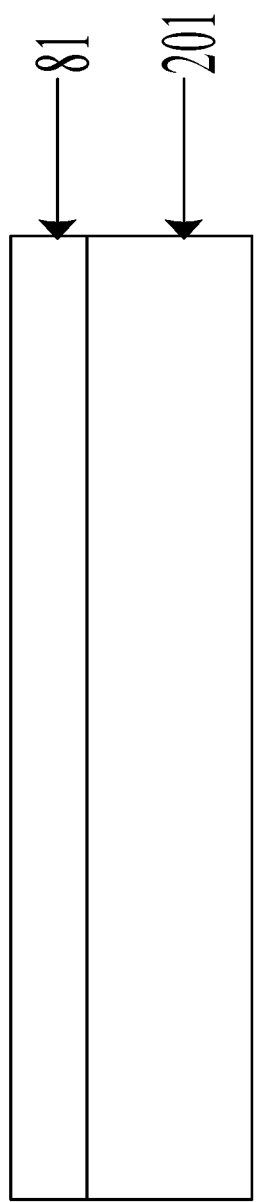
FIG. 8 is a structural diagram showing a center sub-electrode material layer having been formed on the base substrate, provided in the embodiments of the present disclosure.
Figure 9:
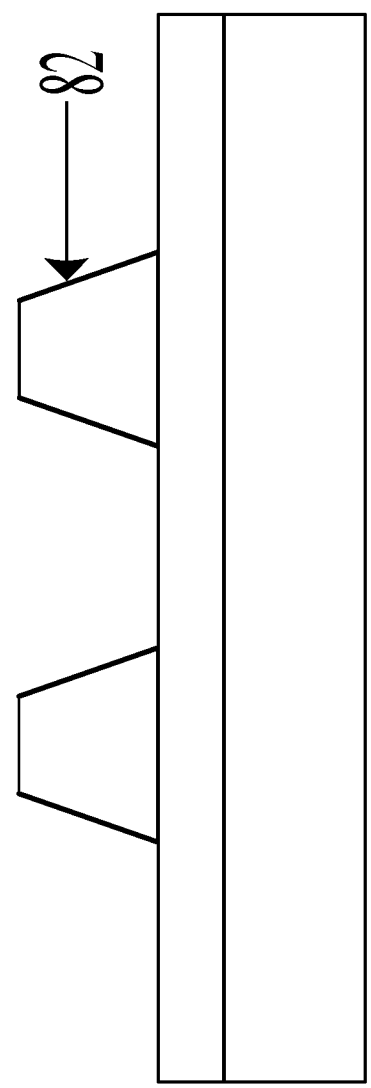
FIG. 9 is a structural diagram showing a first photoresist pattern having been formed on the center sub-electrode material layer shown in FIG. 8, provided in the embodiments of the present disclosure.
Figure 10:
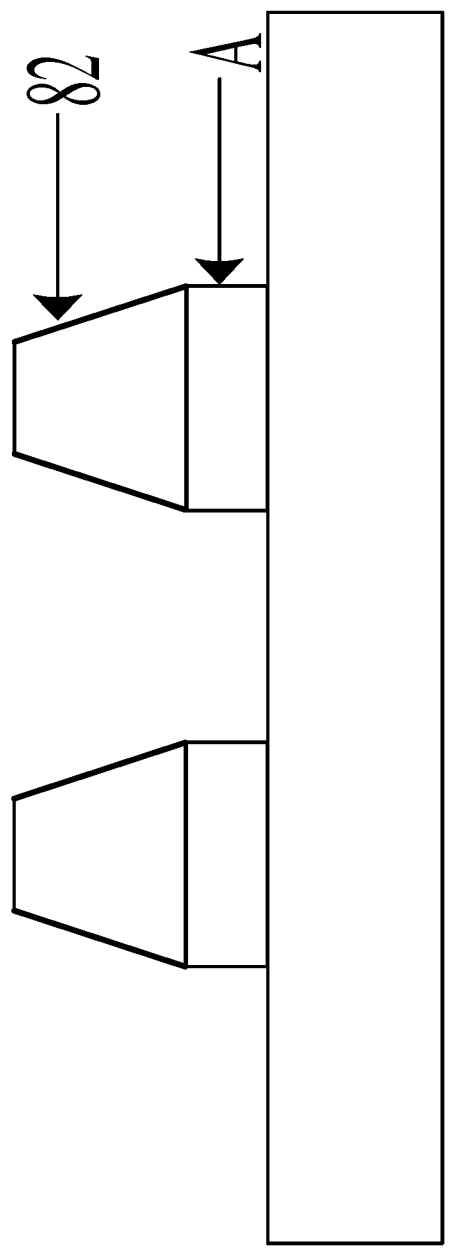
FIG. 10 is a structural diagram showing a center sub-electrode pattern having been etched on the basis of the first photoresist pattern shown in FIG. 9, provided in the embodiments of the present disclosure.

Exemplarily, as shown in FIG. 8, a center sub-electrode material layer 81 may be formed on the base substrate 201 through sputtering or other processes. Further, as shown in FIG. 9, a first photoresist layer is formed on the center sub-electrode material layer 81 (such as by coating the first photoresist layer) and then exposed and developed to form a first photoresist pattern 82 corresponding to the plurality of center sub-electrodes. Further, as shown in FIG. 10, a center sub-electrode pattern A is etched on the basis of the first photoresist pattern 82, wherein the center sub-electrode pattern includes a plurality of center sub-electrodes. Optionally, the etching may include dry etching or wet etching, which is not limited in the embodiments of the present disclosure.

The ring-shaped sub-electrode material layer is formed on the base substrate, on which the center sub-electrode has been formed, and then the ring-shaped sub-electrode is formed on the ring-shaped sub-electrode material layer through a patterning process. The patterning process may include photoresist coating, exposure, development, etching and photoresist peeling-off.

Figure 11:
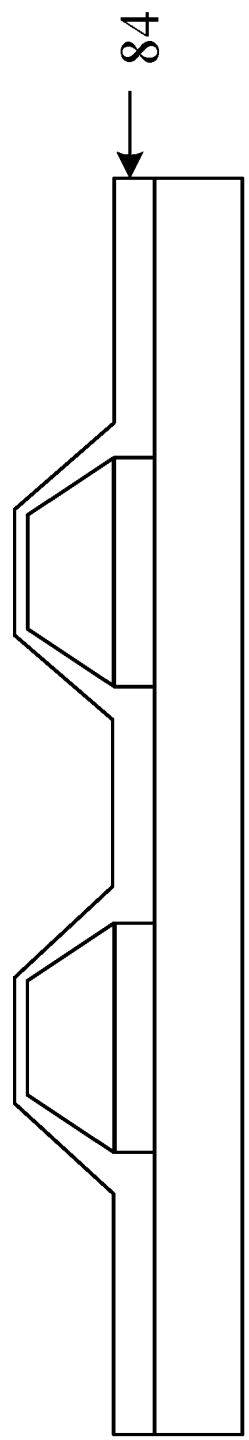
FIG. 11 is a structural diagram showing a ring-shaped sub-electrode material layer having been formed on the base substrate shown in FIG. 10, provided in the embodiments of the present disclosure.
Figure 12:
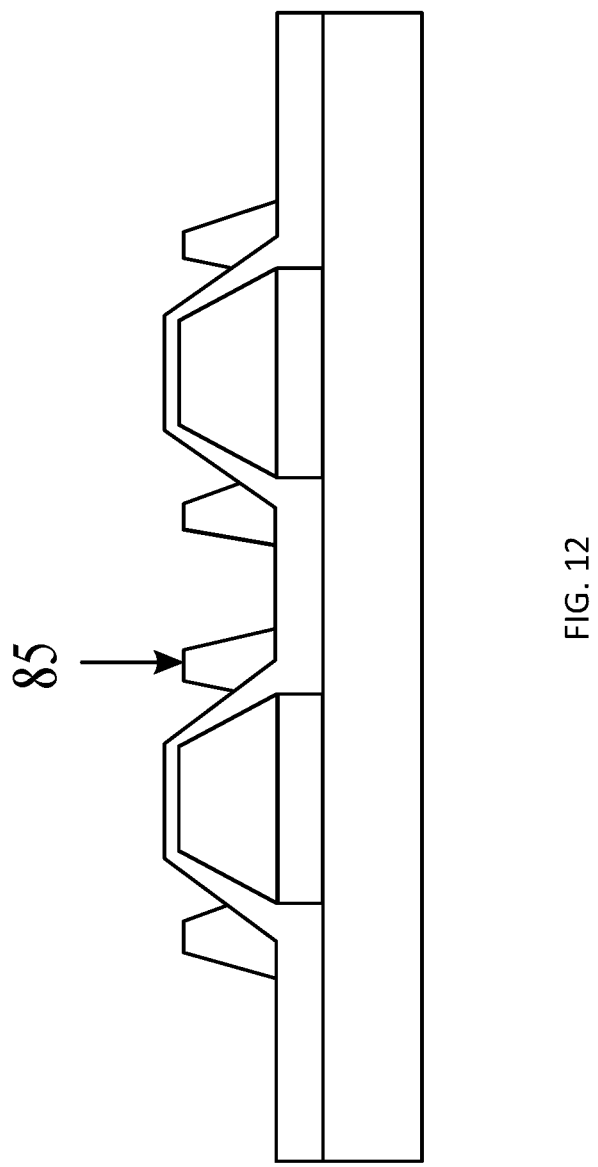
FIG. 12 is a structural diagram showing a second photoresist pattern having been formed on the ring-shaped sub-electrode material layer shown in FIG. 11, provided in the embodiments of the present disclosure.
Figure 13:
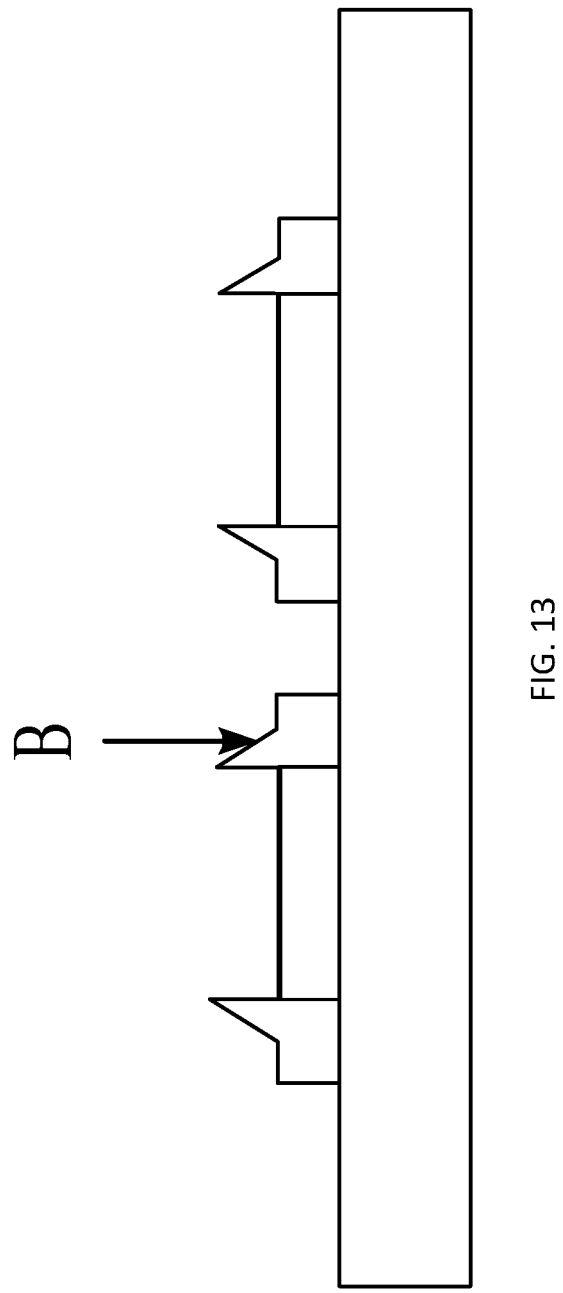
FIG. 13 is a structural diagram showing a first electrode having been formed on the basis of the second photoresist pattern shown in FIG. 12, provided in the embodiments of the present disclosure.

Exemplarily, as shown in FIG. 11, a ring-shaped sub-electrode material layer 84 may be formed on the base substrate 80 through sputtering or other processes. The ring-shaped sub-electrode material layer 84 covers the center sub-electrode pattern A with the first photoresist pattern 82. Further, as shown in FIG. 12, a second photoresist pattern 85 corresponding to the ring-shaped sub-electrode is formed on the ring-shaped sub-electrode material layer 84 through exposure and development. Further, as shown in FIG. 13, a ring-shaped sub-electrode pattern B is etched on the basis of the photoresist pattern 85, wherein the ring-shaped sub-electrode pattern B includes a plurality of ring-shaped sub-electrodes. The photoresist is peeled off, that is, the first photoresist pattern and the second photoresist pattern are peeled off. Optionally, the etching may include dry etching and wet etching, and the photoresist may be a positive photoresist and a negative photoresist. The embodiments of the present disclosure are demonstrated by taking the photoresist being the positive photoresist as an example.

It should be noted that it can be seen from FIG. 12 that the ring-shaped sub-electrode B formed through step 701 has a protrusion. However, since the ring-shaped sub-electrode B is very thin, the protrusion would not have a substantial influence on the improvement on the brightness uniformity of light emitted by the organic light-emitting layer of the OLED display panel provided in the embodiments of the present disclosure.

In step 701, the above sub-pixel regions overlap with regions defined by a pixel defining layer to be formed.

In step 702, the pixel defining layer is formed on the base substrate, on which the plurality of first electrodes have been formed.

Figure 14:
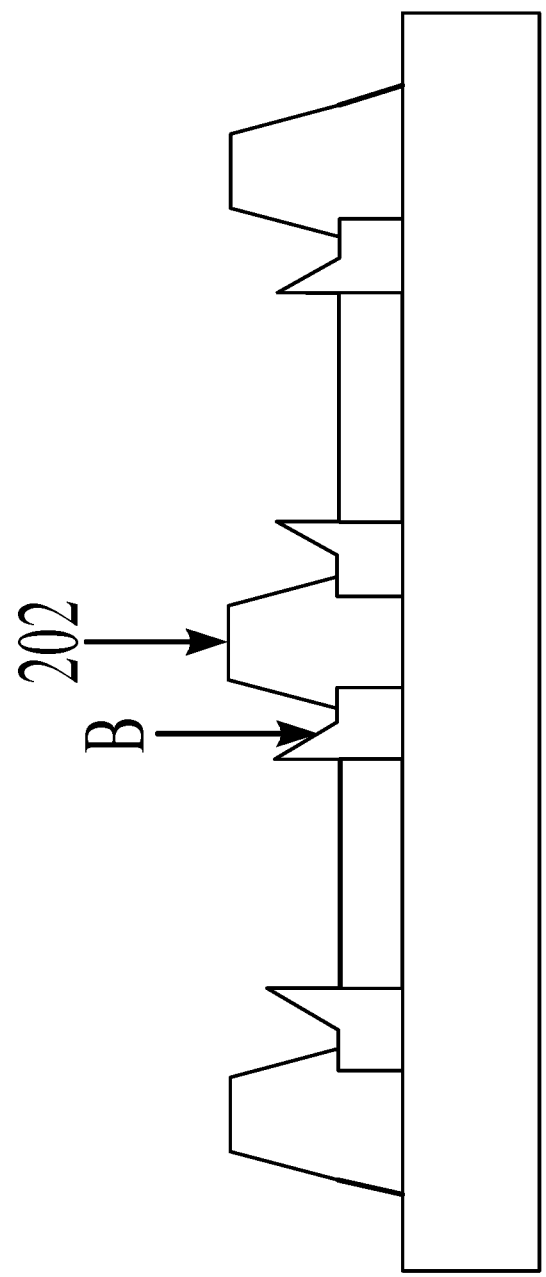
FIG. 14 is a structural diagram showing the pixel defining layer having been formed on the base substrate shown in FIG. 13, provided in the embodiments of the present disclosure.
Figure 15:
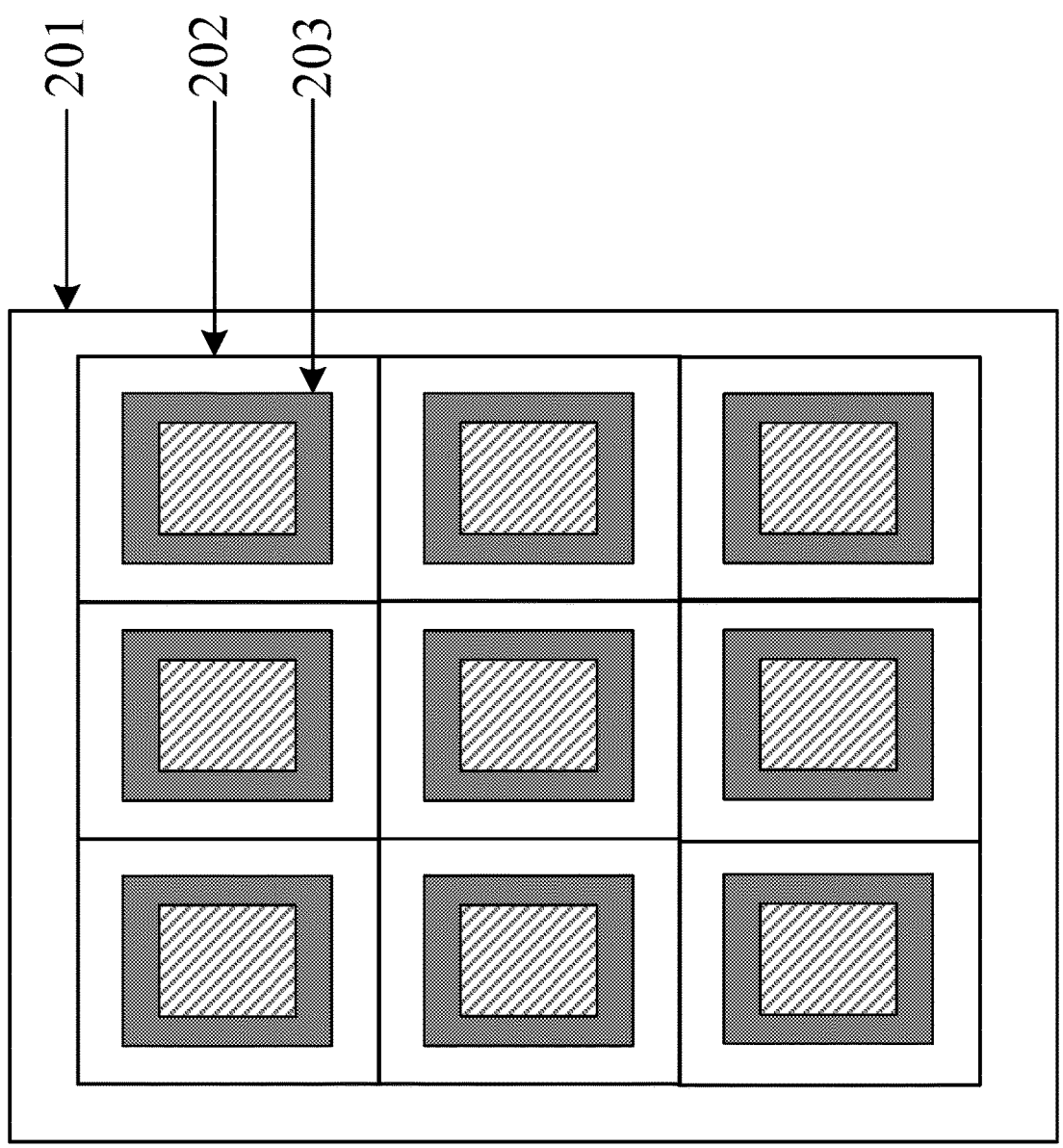
FIG. 15 is a top view partial structural diagram of a base substrate, on which the pixel defining layer has been formed, provided in the embodiments of the present disclosure.

Optionally, as shown in FIG. 14, the pixel defining layer 202 could be formed on the base substrate, on which the plurality of first electrodes have been formed, through a patterning process. The patterning process may include photoresist coating, exposure, development, etching and photoresist peeling-off. FIG. 15 shows a top view of a partial structural diagram of a base substrate 201, on which the pixel defining layer 202 has been formed. It can be seen from the figure that the pixel defining layer 202 has a plurality of hollowed regions which may be arranged in a matrix. The pixel defining layer may usually be an integrated layered structure. To facilitate viewing by readers, in FIG. 15, the pixel defining layer is divided into a plurality of pixel defining structures. Each of the pixel defining structures includes a hollowed region and a ring-shaped enclosure surrounding the hollowed region. The pixel defining layer 202 may define, on the base substrate 201, a plurality of sub-pixel regions arranged in an array (one sub-pixel region is the region where one of the plurality of hollowed regions is located, and each sub-pixel region is defined by a ring-shaped enclosure). In each of the sub-pixel regions. A center sub-electrode and one ring-shaped sub-electrode arranged around the center sub-electrode are arranged (the reference signs of which are not shown in the figure).

It should be noted that when viewed from top, the base substrate is usually covered by the pixel defining layer and other film layers. In FIG. 15, the base substrate is schematically depicted for facilitating viewing by readers.

In step 703, an organic light-emitting layer is formed on each of the first electrodes.

Optionally, the organic light-emitting layer may be formed on each of the first electrodes through the ink-jet printing technology.

In step 704, a second electrode electrically connected to the organic light-emitting layer is formed on the base substrate on which the organic light-emitting layer has been formed.

Optionally, the second electrode electrically connected to the organic light-emitting layer may be formed on the base substrate on which the organic light-emitting layer has been formed through a patterning process, wherein the first electrode and the second electrode are different in polarity.

Optionally, each of the plurality of first electrodes included in the OLED display panel provided in the embodiments of the present disclosure may include a center sub-electrode and at least two ring-shaped sub-electrodes arranged around the center sub-electrode. In the process of manufacturing OLED display panels including at least two ring-shaped sub-electrodes, the process of forming the ring-shaped sub-electrode in step 701 above could be repeated based on the area of the sub-pixel region, so as to form the at least ring-shaped sub-electrodes around the center sub-electrode in the sub-pixel region. This is not described in the embodiments of the present disclosure.

The above manufacturing methods of OLED display panels take this sequence: the first electrodes are formed on the base substrate first and then the pixel defining layer is formed on the base substrate on which the first electrodes have been formed. By taking this manufacturing sequence, the pixel defining layer would cover parts of the first electrodes when being formed, thereby avoiding the problem of short circuit and the like which may be caused due to the complete exposure of the first electrodes to the sub-pixel region. In addition, since the etching process used upon forming the first electrodes is usually wet etching process, if the pixel defining layer is formed first, a larger gap may probably be generated among the first electrodes and the pixel defining layer, which would affect the display effect. By taking the sequence of forming the first electrode first and then the pixel defining layer, this situation could be avoided.

Figure 16:
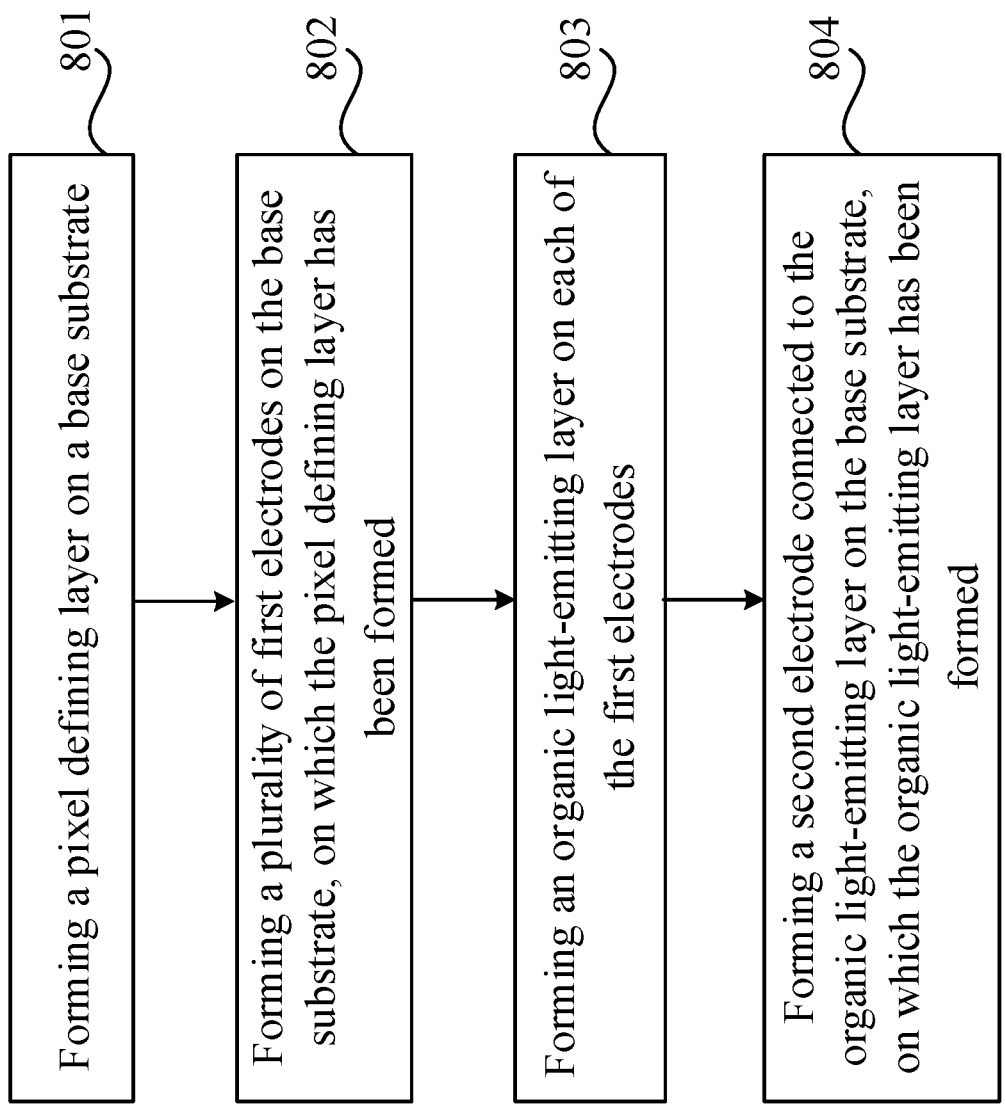
FIG. 16 is a flowchart of still another method for manufacturing OLED display panels provided in the embodiments of the present disclosure.

Optionally, in other embodiments of the present disclosure, the manufacturing method of OLED display panels may also take the sequence of forming the pixel defining layer on the base substrate first and then forming the first electrodes on the base substrate on which the pixel defining layer has been formed. Exemplarily, as shown in FIG. 16, another method for manufacturing OLED display panels provided in the embodiments of the present disclosure is shown and includes the following processes.

In step 801, a pixel defining layer is formed on a base substrate.

Exemplarily, the pixel defining layer may be formed around sub-pixel regions on the base substrate through a patterning process.

In step 802, a plurality of first electrodes are formed on the base substrate, on which the pixel defining layer has been formed.

Exemplarily, reference may be made to step 701 above to form the plurality of first electrodes on the base substrate on which the pixel defining layer has been formed.

In step 803, an organic light-emitting layer is formed on each of the first electrodes.

Specific process may make reference to the description of step 703 above and is not repeated in these embodiments of the present disclosure.

In step 804, a second electrode connected to the organic light-emitting layer is formed on the base substrate, on which the organic light-emitting layer has been formed.

Specific process may make reference to the description of step 704 above and is not repeated in these embodiments of the present disclosure.

It should be noted that in the above method embodiments, the manufacturing methods of OLED display panels, in which a first electrode includes a center sub-electrode and one ring-shaped sub-electrode, are used as examples. When a first electrode includes a center sub-electrode and at least two strip-shaped sub-electrodes, the manufacturing method of the center sub-electrode may make reference to the manufacturing method of the center sub-electrode in the above method embodiments, and the manufacturing method of the strip-shaped sub-electrode may make reference to the manufacturing method of the above ring-shaped sub-electrode, which are not repeated in these embodiments of the present disclosure.

In summary, in the methods for manufacturing OLED display panels provided in the embodiments of the present disclosure, a plurality of sub-pixel regions arranged in an array are formed on the base substrate, one of the first electrodes is formed in each of the sub-pixel regions, and the work function of the first electrode increases sequentially in the direction away from the center of the first electrode. With such arrangement, the number of the holes injected into different regions of the light-emitting electrode layer could be adjusted to correct the brightness difference of the light-emitting electrode layer caused by the non-uniform thickness. This solves the problem in the related art that the light emitted by the organic light-emitting layer has relatively poorer brightness uniformity and the uniformity of light emitted by the organic light-emitting layer is improved.

A person skilled in the art could clearly understand that for the sake of convenience and conciseness in description, specific steps of the above methods may make reference to corresponding processes in the above device embodiments and are not further described here.

The embodiments of the present disclosure further provide display devices including the OLED display panels provided in the above embodiments. The display device may be any product or component having a display function, such as a mobile phone, a tablet computer, a television, a display, a laptop computer, a digital photo frame and a navigator.

It should be noted in the above embodiments, the thickness direction of each film layer is the direction perpendicular to the base substrate.

In the accompanying drawings, the dimensions of layers and regions may be exaggerated for the clarity of illustration. It may be understood that when an element or a layer is referred to as "on" another element or layer, the element or layer may be directly arranged on the other element, or there may be any intermediate layer(s). Similar reference numerals indicate similar elements throughout the text.

In the present disclosure, the terms "first" and "second" are merely used for description, but not denote or imply any relative importance. The term "a plurality of" means two or more, unless otherwise expressly indicated.

In the present disclosure, the term "at least one of E and F" merely describes an association relationship between associated objects and indicates that there may be three relationships. For example, at least one of E and F may indicate that there are three cases, where E exists separately, E and F exist at the same time, and F exists separately.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. An organic light-emitting diode display panel, comprising:
   a base substrate;
   a pixel defining layer and a plurality of first electrodes on the base substrate, wherein the pixel defining layer defines, on the base substrate, a plurality of sub-pixel regions arranged in an array, one of the first electrodes is formed in each of the sub-pixel regions, wherein each of the plurality of first electrodes comprises a center sub-electrode, and at least one ring-shaped sub-electrode each surrounding the center sub-electrode in a nested manner; the center sub-electrode and the at least one ring-shaped sub-electrode are arranged on a same layer; and a work function of any sub-electrode closer to the center sub-electrode is lower than a work function of any sub-electrode further away from the center sub-electrode;
   an organic light-emitting layer on each of the first electrodes; and
   a second electrode electrically connected to the organic light-emitting layer, wherein the first electrode is an anode and the second electrode is a cathode.

2. The organic light-emitting diode display panel according to claim 1, wherein the first electrode is made of a transparent conductive material.

3. The organic light-emitting diode display panel according to claim 2, wherein a material of the center sub-electrode comprises any of indium tin oxide and zinc oxide; and
   a material of comprises any of indium zinc oxide and aluminum-doped zinc oxide.

4. The organic light-emitting diode display panel according to claim 1, wherein the number of the ring-shaped sub-electrode in the first electrode is one, and
   wherein a work function of the ring-shaped sub-electrode is higher than a work function of the center sub-electrode.

5. The organic light-emitting diode display panel according to claim 4, wherein the ring-shaped sub-electrode has a width of 3-10 microns.

6. The organic light-emitting diode display panel according to claim 1, wherein the first electrode meets at least one of the followings:
   the center sub-electrode is rectangular and the ring-shaped sub-electrode is square ring-shaped; and
   a thickness of the center sub-electrode is greater than that of the ring-shaped sub-electrode.

7. The organic light-emitting diode display panel according to claim 1, wherein
   the center sub-electrode is rectangular and the ring-shaped sub-electrode is square ring-shaped;
   a material of the center sub-electrode comprises any of indium tin oxide and zinc oxide; and
   a material of the ring-shaped sub-electrode comprises any of indium zinc oxide and aluminum-doped zinc oxide.

8. A method for manufacturing an organic light-emitting diode display panel, comprising:
   forming a pixel defining layer and a plurality of first electrodes on a base substrate, wherein the pixel defining layer defines, on the base substrate, a plurality of sub-pixel regions arranged in an array, one of the first electrodes is formed in each of the sub-pixel regions, wherein each of the plurality of first electrodes comprises a center sub-electrode, and at least one ring-shaped sub-electrode each surrounding the center sub-electrode in a nested manner; the center sub-electrode and the at least one ring-shaped sub-electrode are arranged on a same layer; and a work function of any sub-electrode closer to the center sub-electrode is lower than a work function of any sub-electrode further away from the center sub-electrode;

forming an organic light-emitting layer on each of the first electrodes; and forming, on the base substrate on which the organic light-emitting layer has been formed, a second electrode electrically connected to the organic light-emitting layer, wherein the first electrode is an anode and the second electrode is a cathode.

9. The method according to claim 8, wherein the forming a pixel defining layer and a plurality of first electrodes on a base substrate comprises:

forming the plurality of first electrodes on the base substrate; and forming the pixel defining layer on the base substrate on which the plurality of first electrodes have been formed.

10. The method according to claim 8, wherein the forming a pixel defining layer and a plurality of first electrodes on a base substrate comprises:

forming the pixel defining layer on the base substrate; and forming the plurality of first electrodes on the base substrate on which the pixel defining layer has been formed.

11. The method according to claim 8, wherein the first electrode is made of a transparent conductive material.

12. The method according to claim 11, wherein a material of the center sub-electrode comprises any of indium tin oxide and zinc oxide; and a material of the ring-shaped sub-electrode comprises any of indium zinc oxide and aluminum-doped zinc oxide.

13. The method according to claim 8, wherein the number of the ring-shaped sub-electrode in the first electrode is one, and wherein a work function of the ring-shaped sub-electrode is higher than a work function of the center sub-electrode.

14. The method according to claim 13, the forming process of the plurality of first electrodes comprises:

forming a first sub-electrode material layer on the base substrate;

forming a first photoresist layer on the first sub-electrode material layer;

exposing, developing and etching the first sub-electrode material layer on which the first photoresist layer has been formed, to obtain a first sub-electrode pattern with a first photoresist pattern, wherein the first sub-electrode pattern comprises the plurality of first sub-electrodes;

forming a second sub-electrode material layer on the base substrate, wherein the second sub-electrode material layer covers the first sub-electrode pattern with the first photoresist pattern;

forming a second photoresist layer on the second sub-electrode material layer;

exposing, developing and etching the second sub-electrode material layer on which the second photoresist layer has been formed, to obtain a second sub-electrode pattern with a second photoresist pattern, wherein the second sub-electrode pattern comprises the plurality of second sub-electrodes; and peeling off the first photoresist pattern and the second photoresist pattern to obtain the first electrode, wherein the first sub-electrode and the second sub-electrode are the center sub-electrode/the ring-shaped sub-electrode or the ring-shaped sub-electrode/the center sub-electrode.

15. The method according to claim 8, wherein the ring-shaped sub-electrode has a width of 3-10 microns.

16. The method according to claim 8, wherein the first electrode meets at least one of the followings:

the center sub-electrode is rectangular and the ring-shaped sub-electrode is square ring-shaped; and a thickness of the center sub-electrode is greater than that of the ring-shaped sub-electrode.

17. A display device, comprising an organic light-emitting diode display panel, and the display panel comprising:

a base substrate;

a pixel defining layer and a plurality of first electrodes on the base substrate, wherein the pixel defining layer defines, on the base substrate, a plurality of sub-pixel regions arranged in an array, one of the first electrodes is formed in each of the sub-pixel regions, wherein each of the plurality of first electrodes comprises a center sub-electrode, and at least one ring-shaped sub-electrode each surrounding the center sub-electrode in a nested manner; the center sub-electrode and the at least one ring-shaped sub-electrode are arranged on a same layer; and a work function of any sub-electrode closer to the center sub-electrode is lower than a work function of any sub-electrode further away from the center sub-electrode;

an organic light-emitting layer on each of the first electrodes; and a second electrode electrically connected to the organic light-emitting layer, wherein the first electrode is an anode and the second electrode is a cathode.

18. The display device according to claim 17, wherein the center sub-electrode is rectangular and the ring-shaped sub-electrode is square ring-shaped;

a material of the center sub-electrode comprises any of indium tin oxide and zinc oxide; and a material of the ring-shaped sub-electrode comprises any of indium zinc oxide and aluminum-doped zinc oxide.

* * * * *